US008951870B2

(12) United States Patent
Basker et al.

(10) Patent No.: US 8,951,870 B2
(45) Date of Patent: Feb. 10, 2015

(54) FORMING STRAINED AND RELAXED SILICON AND SILICON GERMANIUM FINS ON THE SAME WAFER

(71) Applicant: International Business Machines Corporation, Armonk, NY (US)

(72) Inventors: Veeraraghavan S. Basker, Schenectady, NY (US); Bruce Doris, Brewster, NY (US); Ali Khakifirooz, Mountain View, CA (US); Tenko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 13/828,283

(22) Filed: Mar. 14, 2013

(65) Prior Publication Data
US 2014/0264595 A1 Sep. 18, 2014

(51) Int. Cl.
*H01L 29/66* (2006.01)
*H01L 29/78* (2006.01)

(52) U.S. Cl.
CPC ........ *H01L 29/66795* (2013.01); *H01L 29/785* (2013.01); *H01L 29/7855* (2013.01)
USPC ............. 438/283; 257/19; 257/347; 257/368; 438/284; 438/285

(58) Field of Classification Search
USPC ................................... 257/347, 368; 438/198
See application file for complete search history.

(56) References Cited

U.S. PATENT DOCUMENTS

| | | | |
|---|---|---|---|
| 6,794,718 B2 | 9/2004 | Nowak et al. | |
| 6,878,610 B1 * | 4/2005 | Lin et al. | 438/478 |
| 7,115,945 B2 | 10/2006 | Lee et al. | |
| 7,198,995 B2 | 4/2007 | Chidambarrao et al. | |
| 7,247,912 B2 * | 7/2007 | Zhu et al. | 257/353 |
| 7,498,216 B2 * | 3/2009 | Nowak | 438/198 |
| 7,619,239 B2 | 11/2009 | Irisawa et al. | |
| 7,705,345 B2 * | 4/2010 | Bedell et al. | 257/19 |

(Continued)

OTHER PUBLICATIONS

Maitra, K., et al., "Aggressively Scaled Strained-Silicon-on-Insulator Undoped-Body Hih-k/Metal-Gate nFinFETs for High-Performance Logic Applications," 0741-3106/copyright 2011 IEEE, IEEE Electron Device Letters, vol. 32, No. 6, Jun. 2011.

(Continued)

*Primary Examiner* — Olik Chaudhuri
*Assistant Examiner* — Charles N Ausar-El
(74) *Attorney, Agent, or Firm* — Fleit Gibbons Gutman Bongini & Bianco PL; Thomas Grzesik

(57) ABSTRACT

Various embodiments form strained and relaxed silicon and silicon germanium fins on a semiconductor wafer. In one embodiment a semiconductor wafer is formed. The semiconductor wafer comprises a substrate, a dielectric layer, and a strained silicon germanium (SiGe) layer. At least one region of the strained SiGe layer is transformed into a relaxed SiGe region. At least one strained SiGe fin is formed from a first strained SiGe region of the strained SiGe layer. At least one relaxed SiGe fin is formed from a first portion of the relaxed SiGe region. Relaxed silicon is epitaxially grown on a second strained SiGe region of the strained SiGe layer. Strained silicon is epitaxially grown on a second portion of the relaxed SiGe region. At least one relaxed silicon fin is formed from the relaxed silicon. At least one strained silicon fin is formed from the strained silicon.

10 Claims, 11 Drawing Sheets

(56) References Cited

U.S. PATENT DOCUMENTS

| | | | |
|---|---|---|---|
| 7,709,892 B2* | 5/2010 | Anderson et al. | 257/347 |
| 7,847,323 B2* | 12/2010 | Cheng et al. | 257/288 |
| 8,169,025 B2 | 5/2012 | Bedell et al. | |
| 8,207,038 B2 | 6/2012 | Cheng et al. | |
| 8,329,531 B2* | 12/2012 | Hoentschel et al. | 438/218 |
| 8,354,331 B2* | 1/2013 | Cheng et al. | 438/479 |
| 8,373,217 B2* | 2/2013 | Chang | 257/302 |
| 8,669,145 B2* | 3/2014 | Doris et al. | 438/149 |
| 8,741,701 B2* | 6/2014 | Cheng et al. | 438/142 |
| 2006/0014366 A1* | 1/2006 | Currie | 438/517 |
| 2006/0157794 A1* | 7/2006 | Doyle et al. | 257/368 |
| 2008/0169512 A1* | 7/2008 | Doyle et al. | 257/369 |
| 2012/0018730 A1 | 1/2012 | Kanakasabapathy et al. | |
| 2012/0216158 A1* | 8/2012 | Bedell et al. | 716/101 |
| 2012/0280365 A1* | 11/2012 | Cheng et al. | 257/618 |
| 2013/0012025 A1* | 1/2013 | Cheng et al. | 438/696 |
| 2013/0337637 A1* | 12/2013 | Cheng et al. | 438/478 |
| 2014/0008729 A1* | 1/2014 | Bedell et al. | 257/369 |
| 2014/0011328 A1* | 1/2014 | Bedell et al. | 438/154 |

OTHER PUBLICATIONS

Ok, I., et al., "Strained SiGe and Si FinFETs for High Performance Logic with SiGe/Si Stack on SOI," IEDM10-776, 978-1-4233-7419-6/10/copyright 2010 IEEE.

Wu, San Lein, et al., "Enhanced CMOS Performances Using Substrate Strained-SiGe and Mechanical Strained-Si Technology," IEEE Electron Device Letters, vol. 27, No. 1, Jan. 2006, 0741-3106/copyright 2005 IEEE.

* cited by examiner

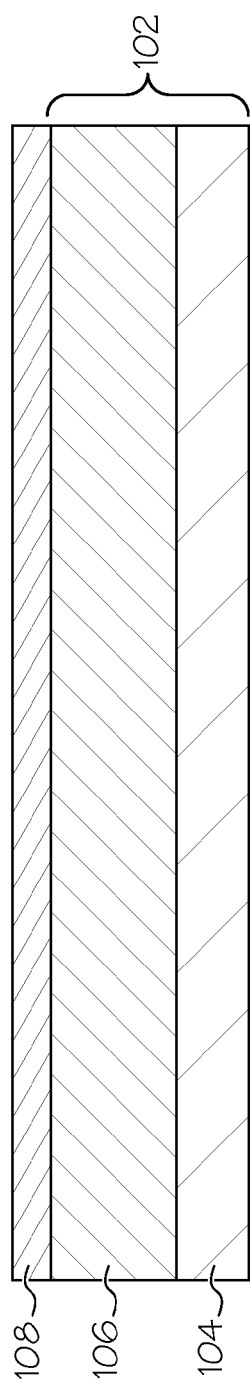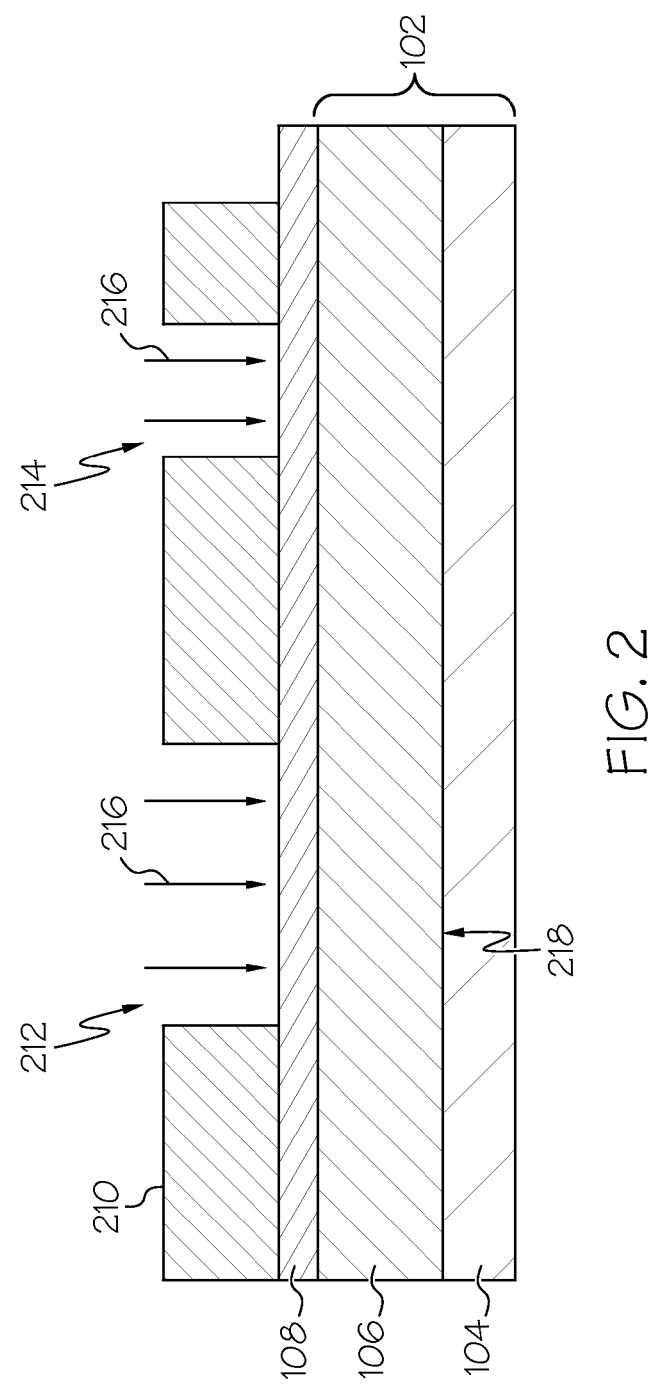

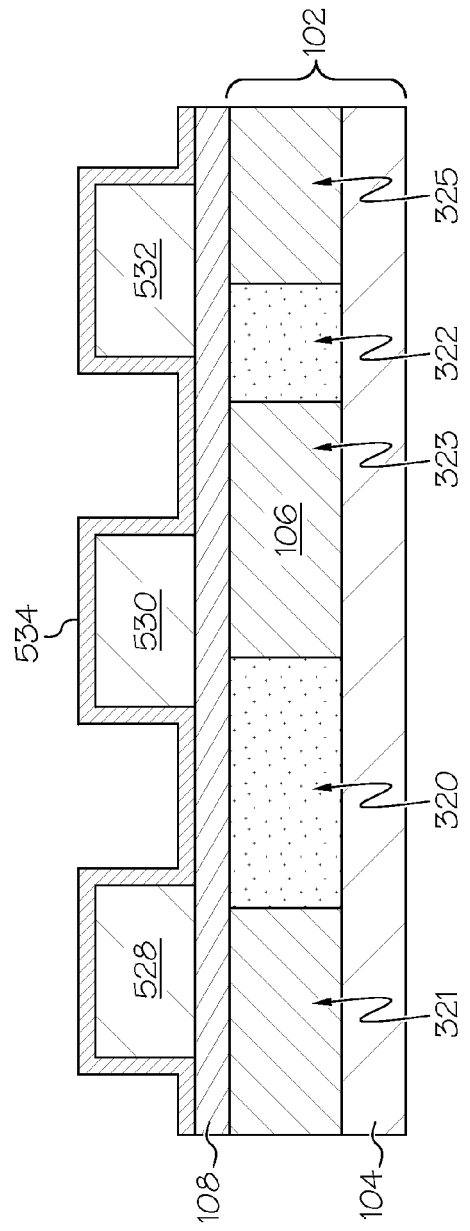
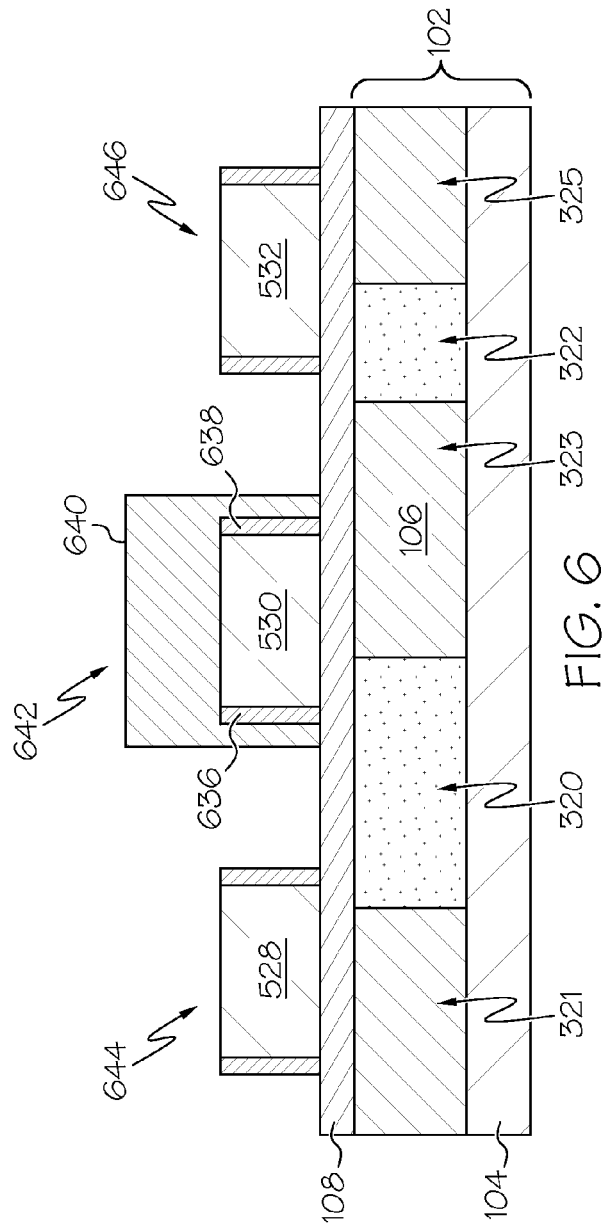

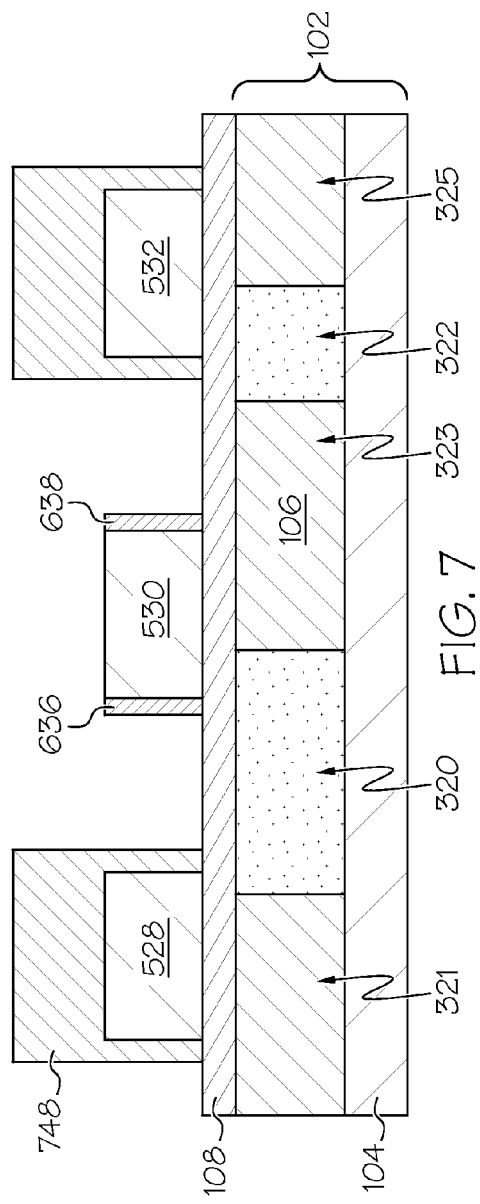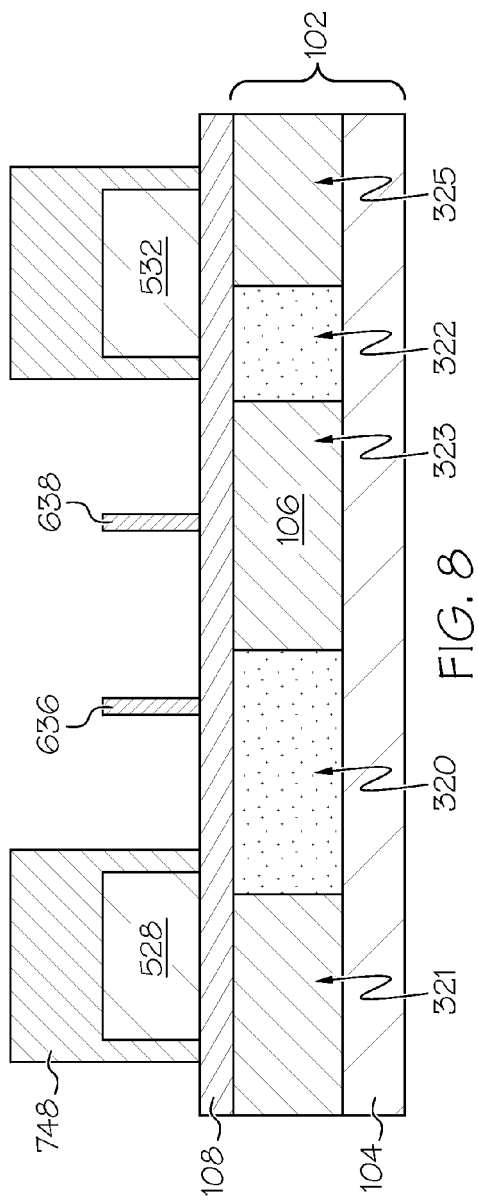

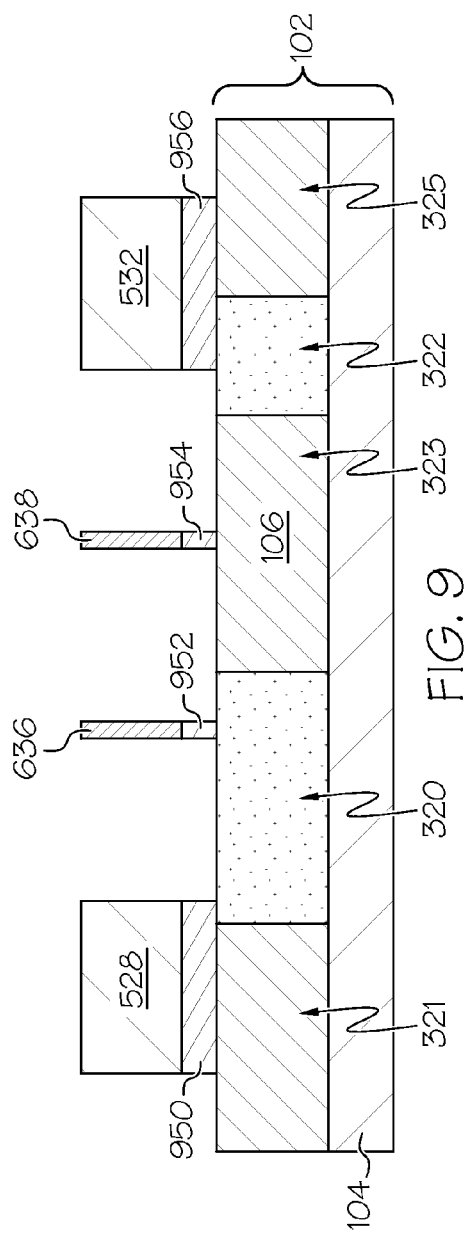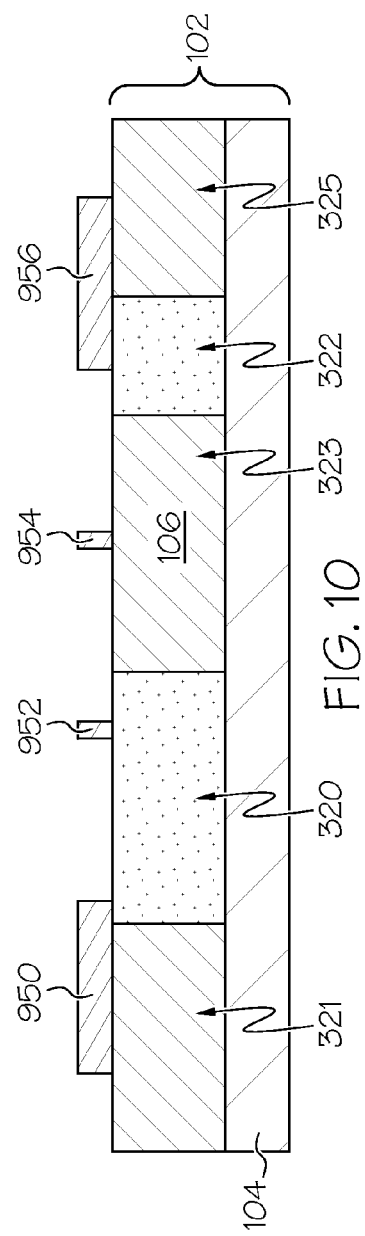

FORMING STRAINED AND RELAXED SILICON AND SILICON GERMANIUM FINS ON THE SAME WAFER

BACKGROUND

The present invention generally relates to semiconductor devices, and more particularly relates semiconductor wafers comprising both strained and relaxed silicon and silicon germanium fins, and methods for fabricating the same.

As integrated circuits continue to scale downward in size, the finFET (fin field effect transistor) is becoming an attractive device for use with smaller nodes, e.g., the 22 nm node and beyond. In a finFET, the channel is formed by a semiconductor fin and a gate electrode is located on at least two sides of the fin. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device generally has faster switching times, equivalent or higher current density, and much improved short channel control than planar CMOS technology utilizing similar critical dimensions. However, one main detractor for realizing such finFET device technology is the ineffectiveness of conventional stress elements that are applied to such devices.

BRIEF SUMMARY

In one embodiment, a method for forming strained and relaxed silicon and silicon germanium fins on a semiconductor wafer is disclosed. The semiconductor wafer comprises a substrate, a dielectric layer formed on the substrate, and a strained silicon germanium (SiGe) layer formed on the dielectric layer. The method comprises forming a semiconductor wafer. The semiconductor wafer comprises a substrate, a dielectric layer formed on the substrate, and a strained silicon germanium (SiGe) layer formed on the dielectric layer. At least one region of the strained SiGe layer is transformed into a relaxed SiGe region. At least one strained SiGe fin is formed from at least a first strained SiGe region of the strained SiGe layer. At least one relaxed SiGe fin is formed from at least a first portion of the at least one relaxed SiGe region. Relaxed silicon is epitaxially grown on at least a second strained SiGe region of the strained SiGe layer. Strained silicon is epitaxially grown on at least a second portion of the relaxed SiGe region. At least one relaxed silicon fin is formed from the relaxed silicon. At least one strained silicon fin is formed from the strained silicon.

In another embodiment, a semiconductor wafer is disclosed. The semiconductor wafer comprises a substrate and a dielectric layer formed on the substrate. A plurality of fins is formed on the dielectric layer. At least one fin comprises strained silicon germanium and at least one fin comprises relaxed silicon germanium. A least one fin comprising strained silicon and at least one fin comprising relaxed silicon.

In yet another embodiment, a non-transitory computer readable medium is disclosed. The non-transitory computer readable medium is encoded with a program for fabricating strained and relaxed silicon and silicon germanium fins on a semiconductor wafer. The semiconductor wafer comprises a substrate, a dielectric layer formed on the substrate, and a strained silicon germanium (SiGe) layer formed on the dielectric layer. The program comprises instructions configured to perform a method. The method comprises forming a semiconductor wafer. The semiconductor wafer comprises a substrate, a dielectric layer formed on the substrate, and a strained silicon germanium (SiGe) layer formed on the dielectric layer. At least one region of the strained SiGe layer is transformed into a relaxed SiGe region. At least one strained SiGe fin is formed from at least a first strained SiGe region of the strained SiGe layer. At least one relaxed SiGe fin is formed from at least a first portion of the at least one relaxed SiGe region. Relaxed silicon is epitaxially grown on at least a second strained SiGe region of the strained SiGe layer. Strained silicon is epitaxially grown on at least a second portion of the relaxed SiGe region. At least one relaxed silicon fin is formed from the relaxed silicon. At least one strained silicon fin is formed from the strained silicon.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 1 is a cross-sectional diagram illustrating a semiconductor wafer according to one embodiment of the present invention;

FIG. 2 is a cross-sectional diagram illustrating an implantation process being performed on the semiconductor wafer of to relax portions of a semiconductor layer according to one embodiment of the present invention;

FIG. 5 is a cross-sectional diagram illustrating a spacer material deposited over the plurality of mandrels according to one embodiment of the present invention;

FIG. 6 is a cross-sectional diagram illustrating sidewall spacers on each of the plurality of mandrels and at least one mandrel having been masked with a masking layer according to one embodiment of the present invention;

FIG. 7 is a cross-sectional diagram illustrating the masked mandrel of FIG. 6 after the masking layer has been removed, and the unmasked mandrels in FIG. 6 after having their sidewall spacers removed and subsequently masked by a masking layer according to one embodiment of the present invention;

FIG. 8 is a cross-sectional diagram illustrating the unmasked mandrel of FIG. 7 having been removed according to one embodiment of the present invention;

FIG. 9 is a cross-sectional diagram illustrating the masking layers having been removed from the masked mandrels of FIG. 8, and exposed portions of a capping layer of the semiconductor wafer having been etched according to one embodiment of the present invention;

FIG. 10 is a cross-sectional diagram illustrating the remaining mandrels and sidewall spacers having been removed according to one embodiment of the present invention;

DETAILED DESCRIPTION

Figure 3:
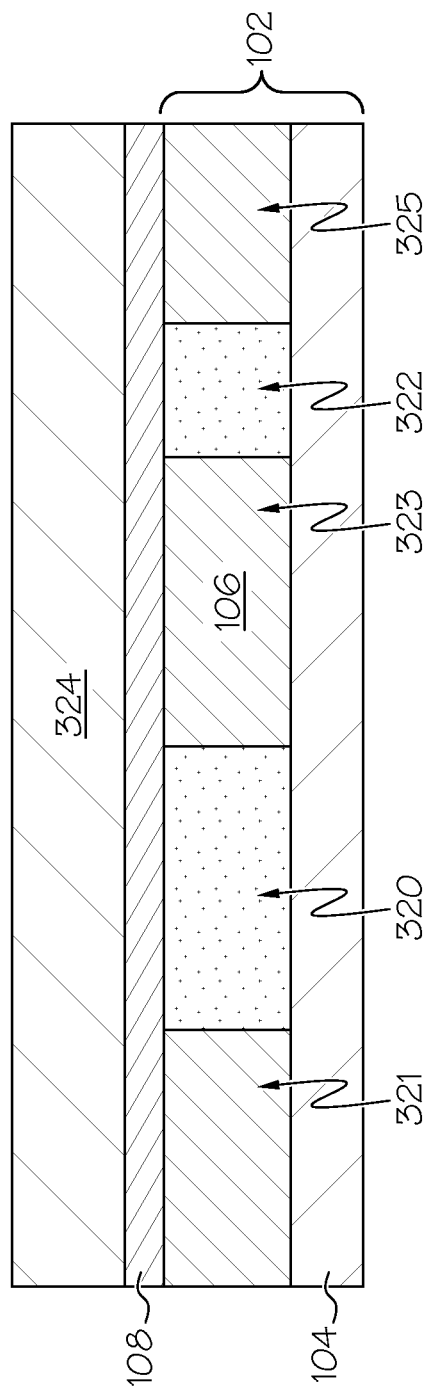
FIG. 3 is a cross-sectional diagram illustrating a mandrel layer deposited over the semiconductor wafer of according to one embodiment of the present invention.

As semiconductor devices continue to scale stress engineering from external stressors becomes more challenging due to the pitch scaling. A strained silicon substrate can be utilized to more efficiently generate the channel strain necessary to achieve high mobility for carrier transport. In addition, a silicon germanium (SiGe) substrate can be utilized for pFET devices for reducing their work function to reach targeted device threshold voltages. Integrating both types of substrates (strained silicon for nFET devices, SiGe for pFET devices) on the same wafer can be challenging. However, one or more embodiments discussed below provide methods and structures for forming strained and relaxed silicon and silicon germanium fins on the same wafer without significantly increasing the process complexity.

It is to be understood that various embodiments are described in terms of a given illustrative architecture having a semiconductor-on-insulator (SOI) wafer; however, other architectures, structures, substrate materials and process features and steps may be varied within the scope of the present invention.

Referring now to the drawings in which like numerals represent the same or similar elements and initially to FIG. 1, a wafer 102 is shown. The wafer 102, in one embodiment, is a semiconductor-on-insulator (SOI) wafer having a substrate (not shown) comprising bulk silicon, germanium, gallium arsenide, or any other substrate material. A dielectric layer 104 is grown or formed on the substrate. The dielectric layer 104, in one embodiment, comprises a buried oxide layer (BOX) or other dielectric material. A strained semiconductor layer 106 comprising silicon germanium (SiGe) is grown or formed on the dielectric layer 104. In one embodiment, the content of Ge within the strained semiconductor layer 106 is 35% to 50%. However, other percentages of Ge content within the strained semiconductor layer 106 are applicable as well.

A pad/capping layer 108 is formed on the strained semiconductor material 106. It should be noted that in other embodiments, the pad/capping layer 108 is formed during or after a fin patterning process. The pad layer 108, in one embodiment, comprises an oxide (e.g., silicon dioxide) or a nitride (e.g., silicon nitride). Other materials may also be employed such as (but not limited to) organic dielectrics, etc. A blocking/masking layer 210 is deposited over the pad layer 108 and patterned to expose multiple portions 212, 214 of the pad layer 108, as shown in FIG. 2. Stated differently, at least a portion of one or more nFET regions and at least a portion of one or more pFET regions are masked by the blocking/masking layer 210. The blocking/masking layer 210, in one embodiment, comprises a photoresist material or a hardmask such as silicon nitride, oxide, oxinitride, or any other material capable of preventing implantation ions from reaching the SiGe material of the strained semiconductor 106 and/or the interface between the strained semiconductor layer 106 and the dielectric layer 104 during a subsequent implantation process.

FIG. 2 shows that ion implantation 216 is performed to relax the strain of the strained semiconductor layer 106 in the exposed regions 212, 214 with an energy and dose optimized to reach the interface 218 between the strained semiconductor layer 106 and the dielectric layer 104. In one embodiment, the ion implantation is hydrogen, helium, or a combination of both and at a dose of $5 \times 10^{15}$ to $5 \times 10^{16}$ cm$^{-2}$. However, other doses are applicable as well. The ion energy is chosen so that the peak of the implanted ions is located near the interface 218 between the strained semiconductor layer 106 and the dielectric layer 104. The ion energy, in one embodiment, is 500 eV to 5 keV. However, other energies are applicable as well. The ion implantation can be performed at around room temperature or at a different temperature. The blocking/mask layer 210 prevents implanted ions from reaching the strained semiconductor layer 106 beneath the blocking/mask layer 210. An annealing (thermal) step is performed, which relaxes any remaining stress in the exposed regions 212, 214. The annealing step can be performed in a furnace, using rapid thermal annealing (RTA) or any other method. For example, the annealing step can be performed at a temperature of about 1050° C., for a time of about 1 second to about 5 seconds. Alternatively, the annealing step can be combined with subsequent annealing steps during device processing.

Figure 4:
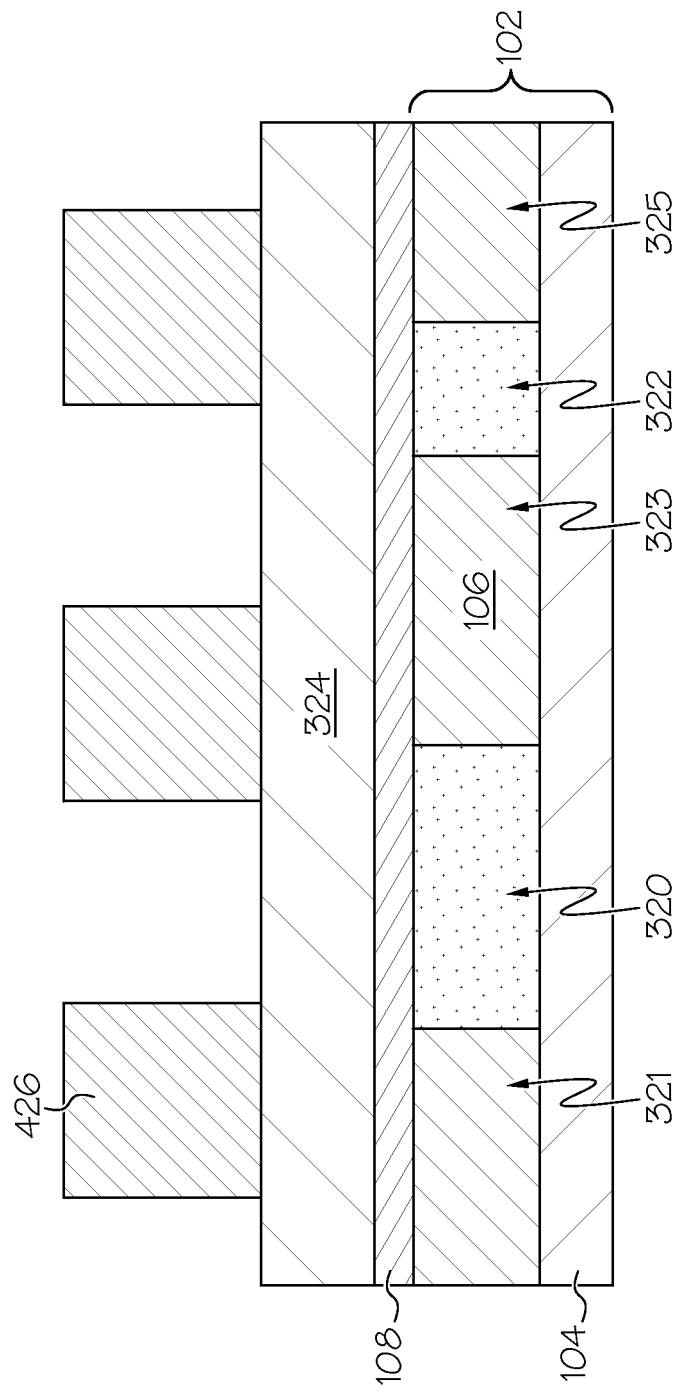
FIG. 4 is a cross-sectional diagram illustrating a mask layer deposited over portions of the mandrel layer of to create a plurality of mandrels according to one embodiment of the present invention.

The implantation and annealing processes discussed above yield areas/regions 320, 322 of relaxed SiGe within the strained semiconductor layer 106, as shown in FIG. 3. Therefore, the strained semiconductor layer 106 comprises both regions 321, 323, 325 of strained SiGe and regions 320, 322 of relaxed SiGe. A mandrel layer 324 is formed on the pad layer 108. The mandrel layer 324 may include silicon (e.g., polycrystalline silicon (polysilicon), amorphous silicon) and may be plasma-enhanced chemical vapor deposition (PECVD) polysilicon or amorphous silicon, or other suitable material. In one embodiment, the pad layer 108 can be optionally removed prior to forming the mandrel layer 324. A blocking/masking layer 426 is formed on the mandrel layer 324, which is subsequently patterned and etched, as shown in FIG. 4. The blocking/masking layer 426 is employed as a mask to etch the mandrel layer 324. The blocking/masking layer 426, in one embodiment, comprises a photoresist material or hardmask such as (but not limited to) silicon nitride, oxide, oxinitride, etc.

After the mandrel layer 324 is etched the blocking/masking layer 426 is removed leaving a plurality of mandrels 528, 530, 532 on the pad layer 108, as shown in FIG. 5. In one embodiment, each of the mandrels 528, 530, 532 is formed over both a portion of a strained SiGe region 321, 323, 325 and a relaxed SiGe region 320, 323. In an embodiment where the pad layer 108 is formed during a subsequent process, the mandrels 528, 530, 532 are formed on the portion of a strained SiGe region 321, 323, 325 and a relaxed SiGe region 320, 323. The mandrels 528, 530, 532 provide a corrugated topology on which spacers are formed using SIT spacer formation. FIG. 5 also shows that a spacer material 532 is deposited over and around the mandrels 528, 530, 532 and on a top surface of the pad layer 108 (if formed). In one embodiment, the spacer material 534 comprises nitride, but other materials are applicable as well.

The spacer material 534 is etched to form spacers 636, 638 on the sidewalls of each of the mandrels 528, 530, 532 using a sidewall image transfer (SIT) spacer formation etch/process, as shown in FIG. 6. The SIT spacer etch is a directional reactive ion etch (RIE). The SIT spacer etch removes material from horizontal surfaces faster than it removes material from vertical surfaces, allowing for relative precision in spacer thickness formation. FIG. 6 further shows that after the sidewall spacers 626, 638 are formed a masking/resist material 640 is formed over mandrel(s) 530 and its sidewall spacers 636, 638 in the region(s) 642 of the wafer 102 where strained and relaxed SiGe fins are desired, e.g., pFET regions of the wafer 102. In one embodiment, this region(s) 642 corresponds to the pFET region(s) of the wafer 102. The mandrels 528, 532 including the sidewall spacers in the regions 644, 646 where strained and relaxed silicon fins are desired are left exposed, e.g., in NFET regions of the wafer 102.

An etching process is then performed to remove the sidewall spacers on the exposed mandrels 528, 532, as shown in FIG. 7. A masking/resist material 748 is then deposited/formed over these mandrels 528, 532 similar to that discussed above with respect to FIG. 6. The exposed mandrel(s) 530 within the PFET region 426 is then removed leaving the spacers 636, 638 of the mandrel 530 on the pad layer 108, as shown in FIG. 8 Mandrels may be removed by a mandrel pull, which can include etching the polysilicon or amorphous silicon that comprises the mandrels.

Figure 11:
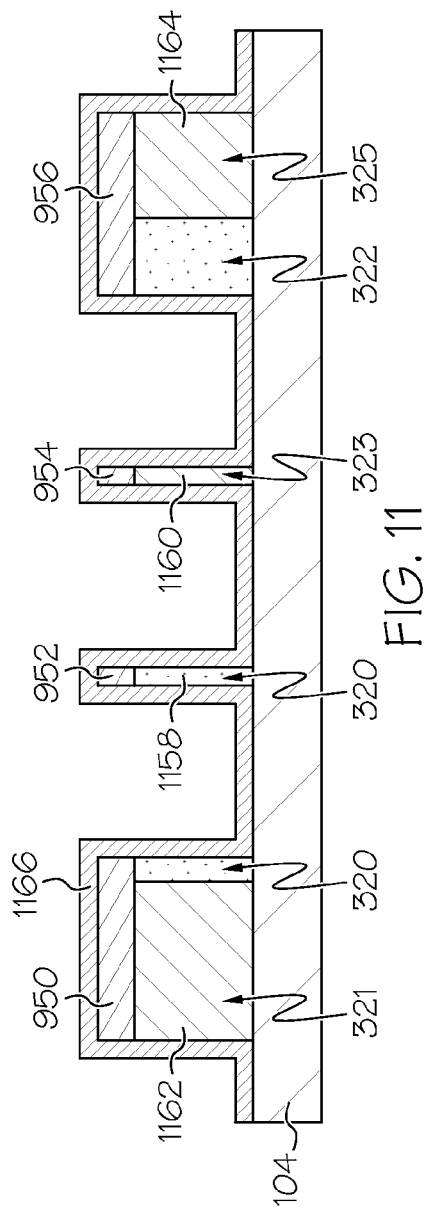
FIG. 11 is a cross-sectional diagram illustrating portions of the semiconductor layer of the wafer having been etched forming relaxed and strained silicon germanium fins and semiconductor regions, and a spacer material having been formed over the fins and semiconductor regions according to one embodiment of the present invention.

The masking/resist material 748 covering the remaining mandrels 528, 530 is then removed, as shown in FIG. 9. An etching process such as RIE is performed on the pad layer 108 (if formed). The mandrels 528, 530 and the spacers 636, 638 act as masking layers that prevent corresponding portions 950, 952, 954, 956 of the pad layer 108 from being etch. The remaining mandrels 528, 532 and the spacers 636, 638 are then removed using an additional etching process, as shown in FIG. 10. The portions 950, 952, 954, 956 of the pad layer 108 are used as a masking a layer while exposed portions of the strained semiconductor layer 106 are etched down to the dielectric layer 104, as shown in FIG. 11. If the pad layer 108 has not been previously formed it can be formed and patterned to create the portions shown in FIG. 9 prior to etching the exposed portions of the semiconductor layer 106. The exposed portions of the semiconductor layer 106 can be etched using RIE or any other suitable etching process. This etching process forms a one or more fins 1158 comprised of strained SiGe 323 and one or more fins 1160 comprised of relaxed SiGe 320. Each of these fins 1158, 1160 has a thickness corresponding to the thickness of their corresponding sidewall; spacers 636, 638 (and pad layer portion 952, 954 if formed). This etching process also defines semiconductor regions (SiGe regions) 1162, 1164 comprising both strained SiGe 321, 325 and relaxed SiGe 320, 322.

Figure 12:
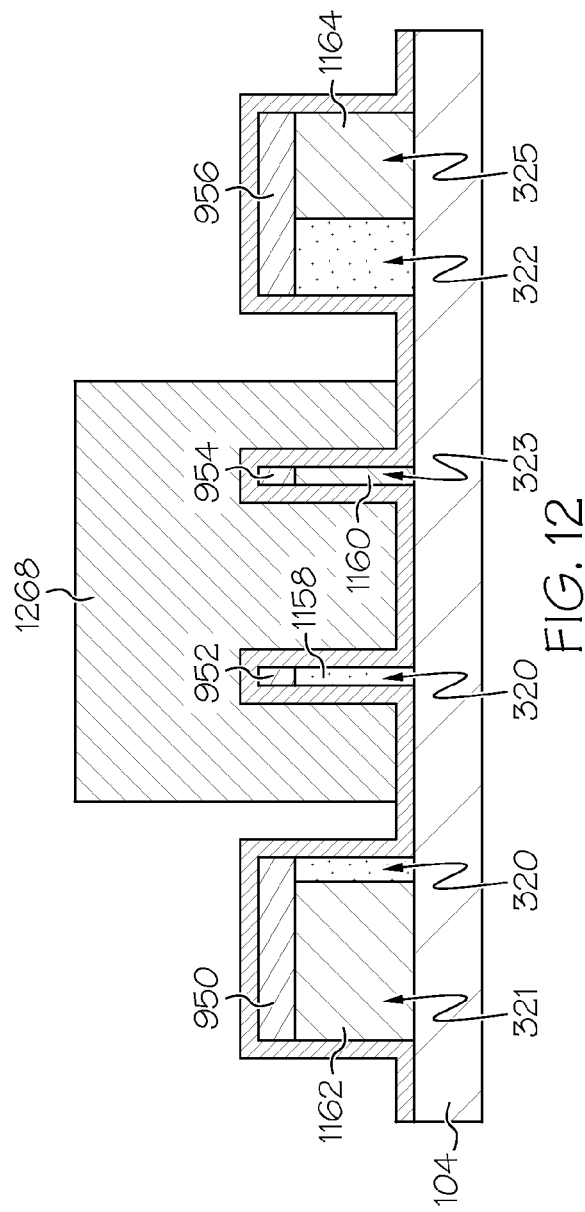
FIG. 12 is a cross-sectional diagram illustrating a masking layer having been deposited over the relaxed and strained silicon germanium fins according to one embodiment of the present invention.
Figure 13:
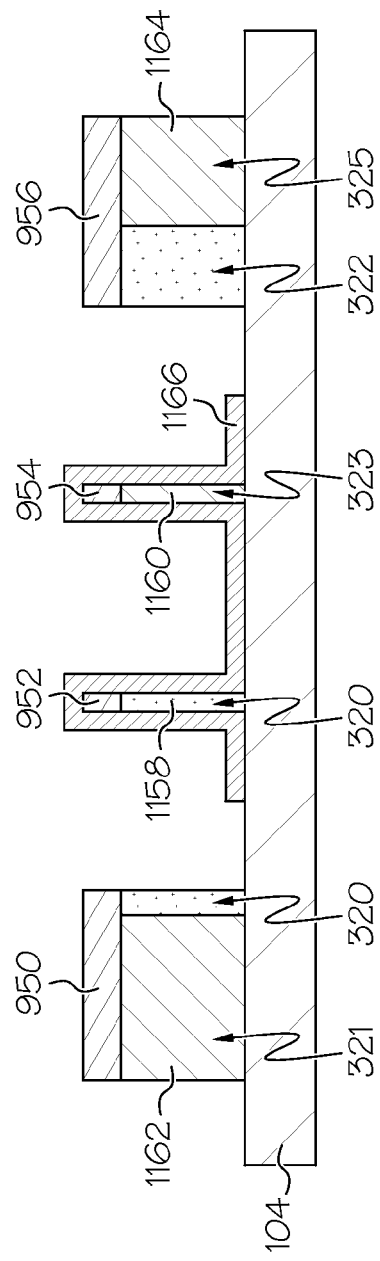
FIG. 13 is a cross-sectional diagram illustrating the spacer material having been removed from the semiconductor regions and the masking layer having been removed from the relaxed and strained silicon germanium fins according to one embodiment of the present invention.

After the fins 1158, 1160 and semiconductor regions 1162, 1164 are formed a mask 1166 is deposited over exposed regions of the dielectric layer 104, the semiconductor regions 1162, 1164, and the fins 1158, 1160 along with any respective pad layer portions 950, 952, 954, 956 (if formed). The mask 950 comprises nitride or another suitable material. A blocking/masking layer 1268 is formed over and around the fins 1158, 1160 and corresponding nitride 1166 as shown in FIG. 12. The blocking/masking layer 1268 comprises a photoresist material or hard mask such as (but not limited to) silicon nitride, oxide, oxinitride, etc. An etching process is then performed to remove the nitride 1160 material from the semiconductor regions 1162, 1164, as shown in FIG. 13. The blocking/masking layer 1268 prevents the nitride 1166 from being removed from the existing fins 1158, 1160 during this etching process. The blocking/masking layer 1268 is then removed from the fins 1158, 1160.

Figure 14:
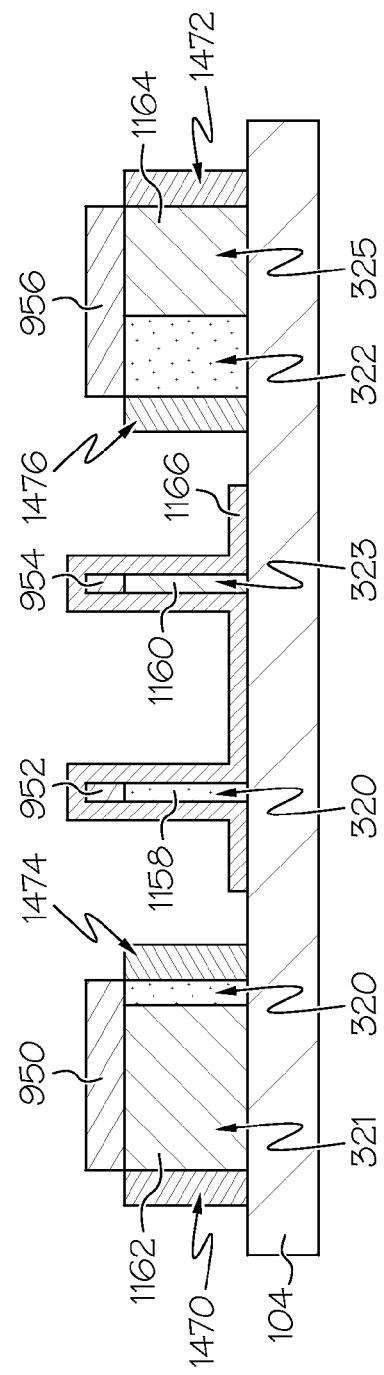
FIG. 14 is a cross-sectional diagram illustrating strained and relaxed silicon having been epitaxially grown on the semiconductor regions according to one embodiment of the present invention.

An epitaxy process is performed to grow relaxed silicon 1470, 1472 and strained silicon 1474, 1476 on the sidewalls of the semiconductor regions 1162, 1164, as shown in FIG. 14. For example, a selective epitaxy process can be used to grow relaxed silicon 1470, 1472 on the exposed strained SiGe surface 321, 325 of the semiconductor regions 1162, 1164 and strained silicon 1474, 1476 on the exposed relaxed SiGe surface 320, 322 of the semiconductor regions 1162, 1164. This selective epitaxy process does not grow silicon on dielectric layers, such as nitride or oxide.

Figure 15:
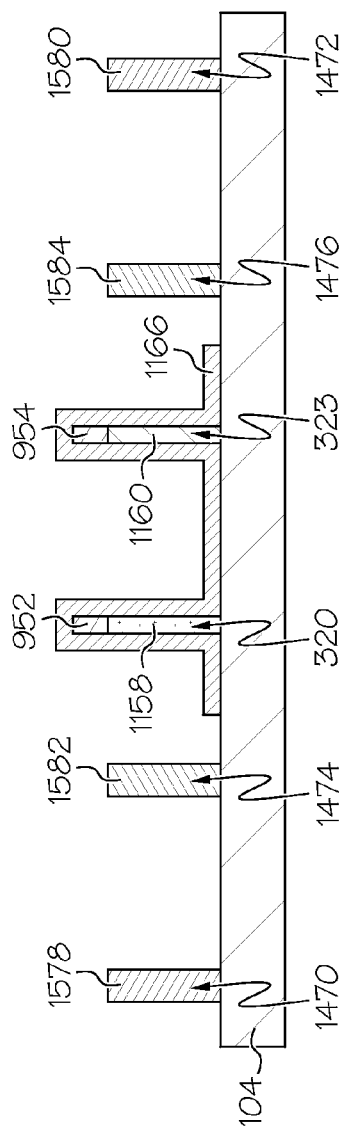
FIG. 15 is a cross-sectional diagram illustrating the semiconductor regions having been removed forming relaxed and strained silicon fins according to one embodiment of the present invention.

Once the relaxed and strained Si layers 1470, 1472, 1474, 1476 have been formed the pad layer portions 950, 956 (if formed) of the semiconductor regions 1162, 1164 are removed using an etching process such as RIE, as shown in FIG. 15. The semiconductor regions 1162, 1164 are removed by an etching process such as (but not limited to) a hydrogen chloride etch. The etching of the semiconductor regions 1162, 1164 forms a plurality of fins 1578, 1580 comprised of the relaxed Si 1470, 1472 and a plurality of fins comprised of the strained Si 1474, 1476.

Figure 16:
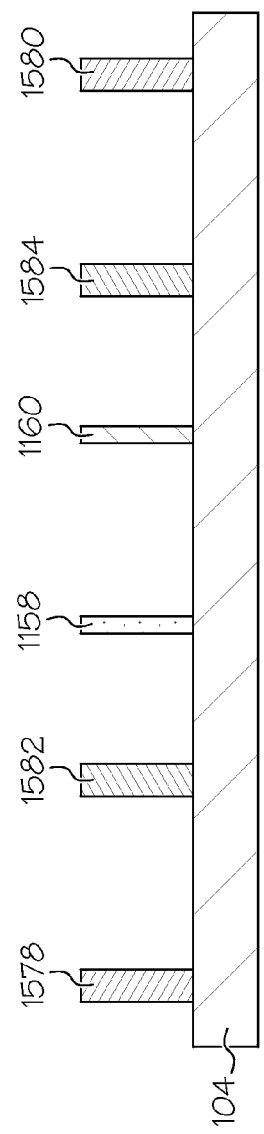
FIG. 16 is a cross-sectional diagram illustrating portions of the capping layer and the spacer material having been removed from the relaxed and strained silicon germanium fins after the relaxed and strained silicon fins have been formed according to one embodiment of the present invention.

The nitride 1166 and pad layer portions 952, 954 (if formed) are removed from the relaxed SiGe fins 1158 and the strained SiGe fins 1160 as shown in FIG. 16. The resulting wafer 102 comprises both relaxed SiGe and Si fins 1158, 1578, 1580 and strained SiGe and Si fins 1160, 1582, 1584. Each of these fins can be utilized to modulate performance as well as threshold voltage for a multi-threshold voltage solution. For example, the relaxed SiGe can be formed in SRAM regions to modulate both threshold voltage and performance. Similarly, strained Si can be utilized in NFET regions for improved performance. Once the fins 1160, 1158, 1578, 1580, 1582, 1584 are formed conventional fabrication process can be used to create devices implementing these fins.

Figure 17:
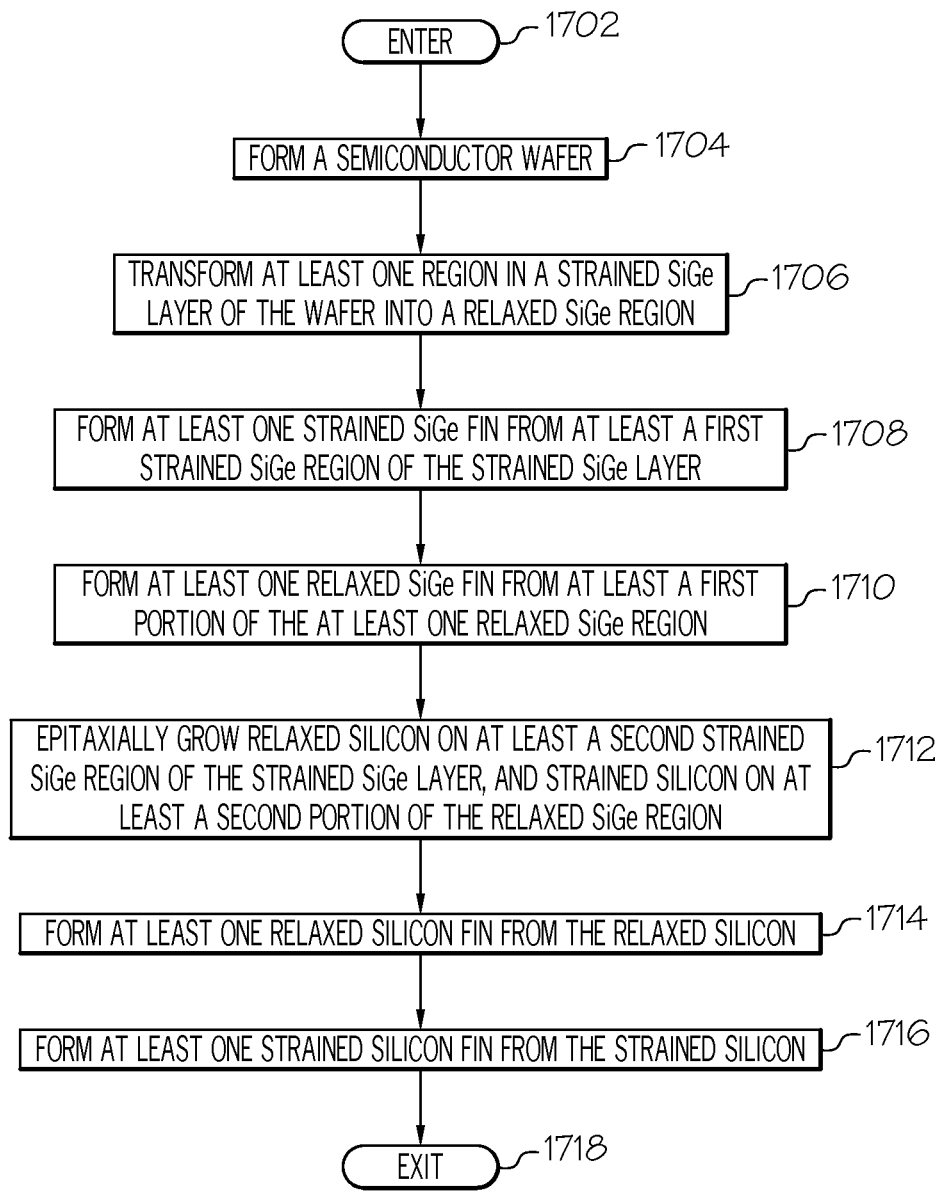
FIG. 17 is an operational flow diagram illustrating one example of a process for fabricating relaxed and strained silicon and silicon germanium fins on the same semiconductor wafer according to one embodiment of the present invention.

FIG. 17 is an operational flow diagram illustrating a process for fabricating strained and relaxed silicon and silicon germanium fins on the same semiconductor wafer. The operational flow diagram of FIG. 17 begins at step 1702 and flows directly to step 1704. A semiconductor wafer, at step 1704, is formed. The semiconductor wafer 102 comprises a substrate, a dielectric layer 104 formed on the substrate, and a strained silicon germanium (SiGe) layer 106 formed on the dielectric layer 104. At least one region of the strained SiGe layer 106, at step 1706, is transformed into a relaxed SiGe region 320.

At least one strained SiGe fin 1170, at step 1708, is formed from at least a first strained SiGe region of the strained SiGe layer 106. At least one relaxed SiGe fin 1158, at step 1710, is formed from at least a first portion of the at least one relaxed SiGe region 320. Relaxed silicon 1470, at step 1712, is epitaxially grown on at least a second strained SiGe region of the strained SiGe layer 106, and strained silicon is epitaxially grown on at least a second portion of the relaxed SiGe region 320. At least one relaxed silicon fin 1578, at step 1714, is formed from the relaxed silicon 1470. At least one strained silicon fin 1582, at step 1716, is formed from the strained silicon 1474. The control flow then exits at step 1718.

Figure 18:
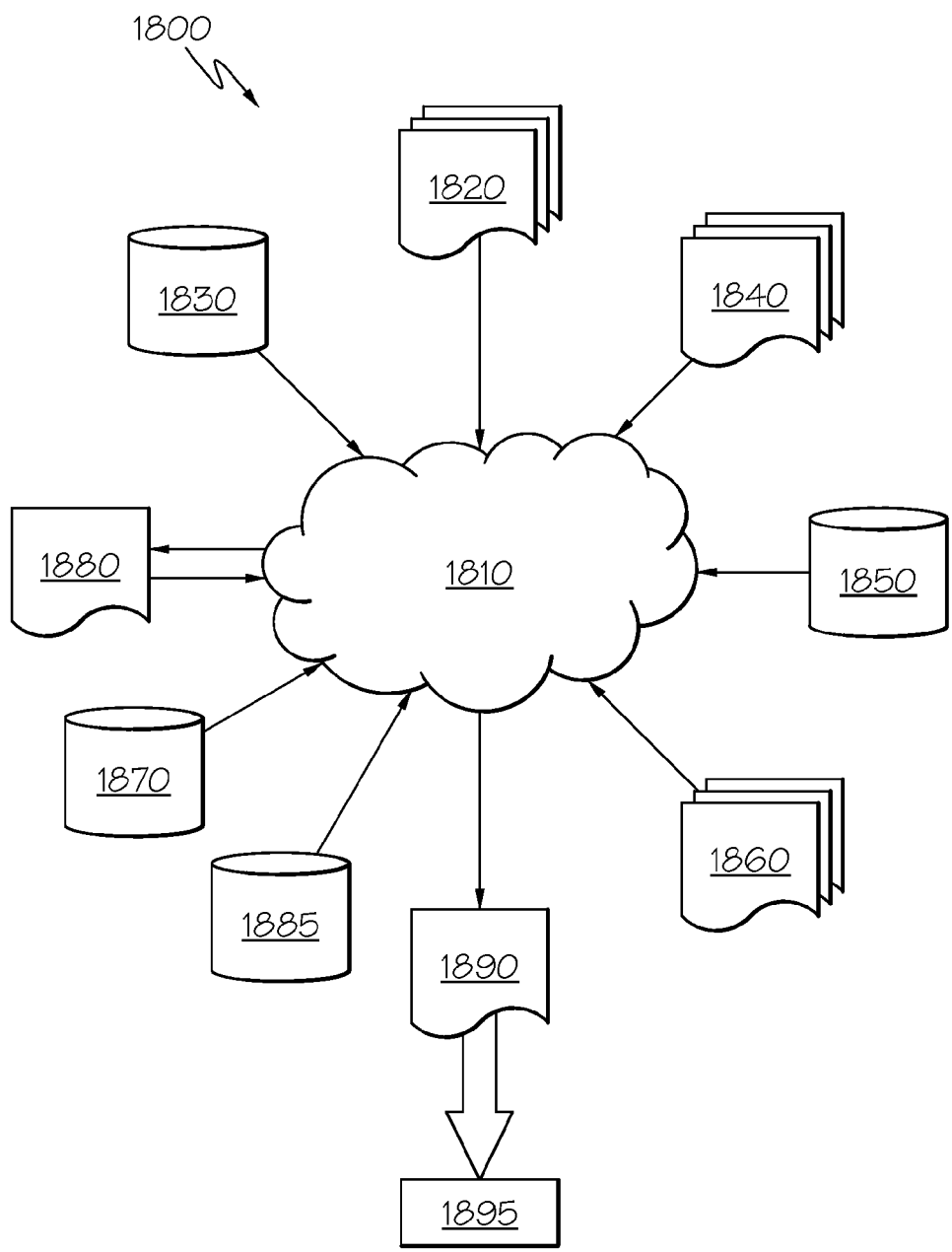
FIG. 18 is a flow diagram of a design process used in semiconductor design, manufacture, and/or test.

FIG. 18 shows a block diagram of an exemplary design flow 1800 used for example, in semiconductor IC logic design, simulation, test, layout, and manufacture. Design flow 1800 includes processes and mechanisms for processing design structures or devices to generate logically or otherwise functionally equivalent representations of the design structures and/or devices described above and shown in FIGS. 1-16. The design structures processed and/or generated by design flow 1800 may be encoded on computer-readable transmission or storage media to include data and/or instructions that when executed or otherwise processed on a data processing system generate a logically, structurally, mechanically, or otherwise functionally equivalent representation of hardware components, circuits, devices, or systems. Design flow 1800 may vary depending on the type of representation being designed. For example, a design flow 1800 for building an application specific IC (ASIC) may differ from a design flow 1800 for designing a standard component or from a design flow 1800 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 1820 that is preferably processed by a design process 1810. Design structure 1820 may be a logical simulation design structure generated and processed by design process 1210 to produce a logically equivalent functional representation of a hardware device. Design structure 1820 may also or alternatively comprise data and/or program instructions that when processed by design process 1810, generate a functional representation of the physical structure of a hardware device. Whether representing functional and/or structural design features, design structure 1820 may be generated using electronic computer-aided design (ECAD) such as implemented by a core developer/designer. When encoded on a machine-readable data transmission, gate array, or storage medium, design structure 1820 may be accessed and processed by one or more hardware and/or software modules within design process 1810 to simulate or otherwise functionally represent an electronic component, circuit, electronic or logic module, apparatus, device, or system such as those shown in FIGS. 1-16. As such, design structure 1820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1810 preferably employs and incorporates hardware and/or software modules for synthesizing, translating, or otherwise processing a design/simulation functional equivalent of the components, circuits, devices, or logic structures shown in FIGS. 1-16 to generate a netlist 1880 which may contain design structures such as design structure 1820. Netlist 1880 may comprise, for example, compiled or otherwise processed data structures representing a list of wires, discrete components, logic gates, control circuits, I/O devices, models, etc. that describes the connections to other elements and circuits in an integrated circuit design. Netlist 1880 may be synthesized using an iterative process in which netlist 1880 is resynthesized one or more times depending on design specifications and parameters for the device. As with other design structure types described herein, netlist 1880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1810 may include hardware and software modules for processing a variety of input data structure types including netlist 1880. Such data structure types may reside, for example, within library elements 1830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1840, characterization data 1850, verification data 1860, design rules 1870, and test data files 1885 which may include input test patterns, output test results, and other testing information. Design process 1810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1810 without deviating from the scope and spirit of the invention. Design process 1810 may also include modules for performing standard circuit design processes such as timing analysis, verification, design rule checking, place and route operations, etc.

Design process 1810 employs and incorporates logic and physical design tools such as HDL compilers and simulation model build tools to process design structure 1820 together with some or all of the depicted supporting data structures along with any additional mechanical design or data (if applicable), to generate a second design structure 1890. Design structure 1890 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 1820, design structure 1890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-16. In one embodiment, design structure 1890 may comprise a compiled, executable HDL simulation model that functionally simulates the devices shown in FIGS. 1-16.

Design structure 1890 may also employ a data format used for the exchange of layout data of integrated circuits and/or symbolic data format (e.g., information stored in a GDSII (GDS2), GL1, OASIS, map files, or any other suitable format for storing such design data structures). Design structure 1890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-16. Design structure 1890 may then proceed to a stage 1895 where, for example, design structure 1890: proceeds to tape-out, is released to manufacturing, is released to a mask house, is sent to another design house, is sent back to the customer, etc.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating strained and relaxed silicon and silicon germanium fins on a semiconductor wafer comprising a substrate, a dielectric layer formed on the substrate, and a strained silicon germanium (SiGe) layer formed on the dielectric layer, the method comprising:
    transforming at least one region of the strained SiGe layer into at least one relaxed SiGe region;
    forming at least one strained SiGe fin from at least a first strained SiGe region of the strained SiGe layer, and at least one relaxed SiGe fin from at least a first portion of the at least one relaxed SiGe region;
    epitaxially growing relaxed silicon on at least a second strained SiGe region of the strained SiGe layer, and strained silicon on at least a second portion of the relaxed SiGe region; and
    forming at least one relaxed silicon fin from the relaxed silicon, and at least one strained silicon fin from the strained silicon.

2. The method of claim 1, further comprising:
    forming a plurality of mandrels, wherein at least a first mandrel is formed above the first strained SiGe region and the first portion of the at least one relaxed SiGe region, and
    wherein at least a second mandrel is formed above the second strained SiGe region and the second portion of the at least one relaxed SiGe region.

3. The method of claim 2, further comprising:
    depositing a spacer material over the plurality of mandrels; and
    removing the spacer material from horizontal surfaces of the plurality of mandrels, wherein the removing forms a first sidewall spacer and at least a second sidewall spacer on each of the plurality of mandrels.

4. The method of claim 3, further comprising:
  removing the first and second sidewall spacers from at least the second mandrel; and
  removing at least the first mandrel after the first and second sidewall spacers have been removed from at least the second mandrel, wherein the first sidewall spacer of the first mandrel remains above a portion of the at least one relaxed SiGe region, and the second sidewall spacer of the first mandrel remains above a portion of the at least first strained SiGe region.

5. The method of claim 4, wherein forming the at least one strained SiGe fin and the at least one relaxed SiGe fin further comprises:
  etching exposed regions of the strained SiGe layer and the at last one relaxed SiGe region, wherein the etching forms the at the least one relaxed SiGe fin and the at least one strained SiGe fin.

6. The method of claim 4, wherein epitaxially growing relaxed silicon and strained silicon further comprises:
  etching exposed regions of the strained SiGe layer and the at last one relaxed SiGe region, wherein the etching forms the at least second strained SiGe region and the at least second portion of the relaxed SiGe region.

7. The method of claim 1, further comprising:
  forming a pad layer on the SiGe layer prior to transforming the at least one region of the strained SiGe layer into the relaxed SiGe region.

8. The method of claim 7, further comprising:
  forming a plurality of mandrels, wherein at least a first mandrel is forms on a first portion of the pad layer over the first strained SiGe region and the first portion of the at least one relaxed SiGe region, and wherein at least a second mandrel is formed on at least a second portion of the pad layer over the second strained SiGe region and the second portion of the at least one relaxed SiGe region;
  forming a first sidewall spacer and at least a second sidewall spacer on each of the plurality of mandrels;
  removing the first and second sidewall spacers from at least the second mandrel; and
  removing at least the first mandrel after the first and second sidewall spacers have been removed from at least the second mandrel, wherein the first sidewall spacer of the first mandrel remains over a third portion of the pad, and the second sidewall spacer of the first mandrel remains over a fourth portion of the pad layer.

9. The method of claim 8, further comprising:
  etching exposed portions of the pad layer, wherein the second portion of the pad layer remains under the at least second mandrel, and wherein the third portion of the pad layer remains under the first sidewall of the first mandrel and the fourth portion of the pad layer remains under the second sidewall of the first mandrel; and
  after etching the exposed portions of the pad layer, removing the second mandrel, the first sidewall of the first mandrel, and the second sidewall of the first mandrel.

10. The method of claim 9, wherein forming the at least one strained SiGe fin and the at least one relaxed SiGe fin further comprises:
  etching exposed regions of the strained SiGe layer and the at last one relaxed SiGe region, wherein the etching forms the at the least one relaxed SiGe fin under the third portion of the pad layer and the at least one strained SiGe fin under the fourth portion of the pad layer; and
  removing at least the third and fourth portions of the pad layer, and wherein epitaxially growing relaxed silicon and strained silicon further comprises:
  etching exposed regions of the strained SiGe layer and the at last one relaxed SiGe region, wherein the etching forms the at least second strained SiGe region and the at least second portion of the relaxed SiGe region under the at least second portion of the pad layer; and
  removing the at least second portion of the pad layer.

* * * * *